(12) United States Patent
Takenaga et al.

(10) Patent No.: US 10,395,934 B2
(45) Date of Patent: Aug. 27, 2019

(54) CONTROL DEVICE, SUBSTRATE PROCESSING SYSTEM, SUBSTRATE PROCESSING METHOD, AND PROGRAM

(71) Applicant: Tokyo Electron Limited, Tokyo (JP)

(72) Inventors: Yuichi Takenaga, Iwate (JP); Takahito Kasai, Iwate (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 15/466,277

(22) Filed: Mar. 22, 2017

(65) Prior Publication Data
US 2017/0278714 A1 Sep. 28, 2017

(30) Foreign Application Priority Data
Mar. 28, 2016 (JP) .................. 2016-063220

(51) Int. Cl.
*H01L 21/66* (2006.01)
*H01L 21/306* (2006.01)
*B32B 37/14* (2006.01)
*B32B 37/02* (2006.01)
*H01L 21/67* (2006.01)

(52) U.S. Cl.
CPC ............ *H01L 21/306* (2013.01); *B32B 37/02* (2013.01); *B32B 37/14* (2013.01); *H01L 21/67225* (2013.01); *H01L 22/12* (2013.01); *B32B 2457/14* (2013.01); *H01L 21/67253* (2013.01)

(58) Field of Classification Search
CPC ..... B32B 2457/14; B32B 37/02; B32B 37/14; H01L 21/306; H01L 21/67225; H01L 22/12; H01L 21/67253; H01L 22/20

USPC ............ 156/345.13, 345.15, 345.24, 345.26; 438/714, 717, 758; 216/67
See application file for complete search history.

(56) References Cited

U.S. PATENT DOCUMENTS

| 8,664,013 B2* | 3/2014 | Takenaga ................ H01L 22/12 118/696 |
| 2008/0213478 A1* | 9/2008 | Matsuura ................ C23C 16/36 427/255.28 |
| 2010/0198386 A1* | 8/2010 | Yamaji .................... C23C 16/52 700/103 |

(Continued)

FOREIGN PATENT DOCUMENTS

JP 2013-207256 A 10/2013

*Primary Examiner* — Lan Vinh
(74) *Attorney, Agent, or Firm* — Abelman, Frayne & Schwab

(57) ABSTRACT

Disclosed is a control device that controls an operation of a substrate processing apparatus that forms a laminated film by forming a first film on a substrate and then forming a second film. The control device includes a recipe memory unit storing first and second film formation conditions to form the first and second films, a model memory storing first and second process models that represent the effects of the first film formation conditions on the properties of the first and second films, and a controller configured to: adjust the second film formation condition based on a measured value of a property of the laminated film formed by the first and second film formation conditions, and the second process model stored in the model memory unit; and determine whether or not to adjust the first film formation condition based on an expected value of the property of the laminated film.

19 Claims, 4 Drawing Sheets

(56) References Cited

U.S. PATENT DOCUMENTS

| | | | |
|---|---|---|---|
| 2014/0187053 A1* | 7/2014 | Goto | C23C 16/4405 438/758 |
| 2014/0335693 A1* | 11/2014 | Takenaga | H01L 21/6708 438/694 |
| 2015/0332912 A1* | 11/2015 | Nowak | C23C 16/54 438/778 |

* cited by examiner

CONTROL DEVICE, SUBSTRATE PROCESSING SYSTEM, SUBSTRATE PROCESSING METHOD, AND PROGRAM

CROSS-REFERENCE TO RELATED APPLICATIONS

This application is based on and claims priority from Japanese Patent Application No. 2016-063220, filed on Mar. 28, 2016, with the Japan Patent Office, the disclosure of which is incorporated herein in its entirety by reference.

TECHNICAL FIELD

The present disclosure relates to a control device, a substrate processing system, a substrate processing method, and a program.

BACKGROUND

In manufacturing a semiconductor device, when a film having a predetermined property is formed on a substrate, such as, for example, a semiconductor wafer (wafer), an optimum film formation condition under which the film having the predetermined property is acquired is calculated in advance, and film formation is performed on the substrate using the calculated optimum film formation condition. When the optimum film formation condition is calculated, knowledge or experience related to a semiconductor manufacturing apparatus or a semiconductor process is required, and the optimum film formation condition may not be easily calculated in some cases.

Conventionally, as a system that calculates an optimum film formation condition, a thermal processing system is known, in which a controller calculates an optimum temperature, which is close to a target film thickness, merely by an operator's inputting of the target film thickness (see, e.g., Japanese Patent Laid-Open Publication No. 2013-207256).

SUMMARY

According to an aspect of the present disclosure, there is provided a control device for controlling an operation of a substrate processing apparatus that forms a laminated film by forming a first film on a substrate, and thereafter forming a second film. The control device includes: a recipe memory unit configured to store film formation conditions including a first film formation condition to form the first film and a second film formation condition to form the second film; a model memory unit configured to store process models including a first process model that represents an effect of the first film formation condition on a property of the first film and a second process model that represents an effect of the second film formation condition on a property of the second film; and a controller configured to: adjust the second film formation condition based on a measured value of a property of the laminated film including the first film and the second film, which are formed by the first film formation condition and the second film formation condition stored in the recipe memory unit, respectively, and the second process model stored in the model memory unit; and determine whether or not to adjust the first film formation condition based on an expected value of the property of the laminated film, which is expected when forming the laminated film by the first film formation condition and the adjusted second film formation condition.

The foregoing summary is illustrative only and is not intended to be in any way limiting. In addition to the illustrative aspects, embodiments, and features described above, further aspects, embodiments, and features will become apparent by reference to the drawings and the following detailed description.

DETAILED DESCRIPTION

Figure 1:
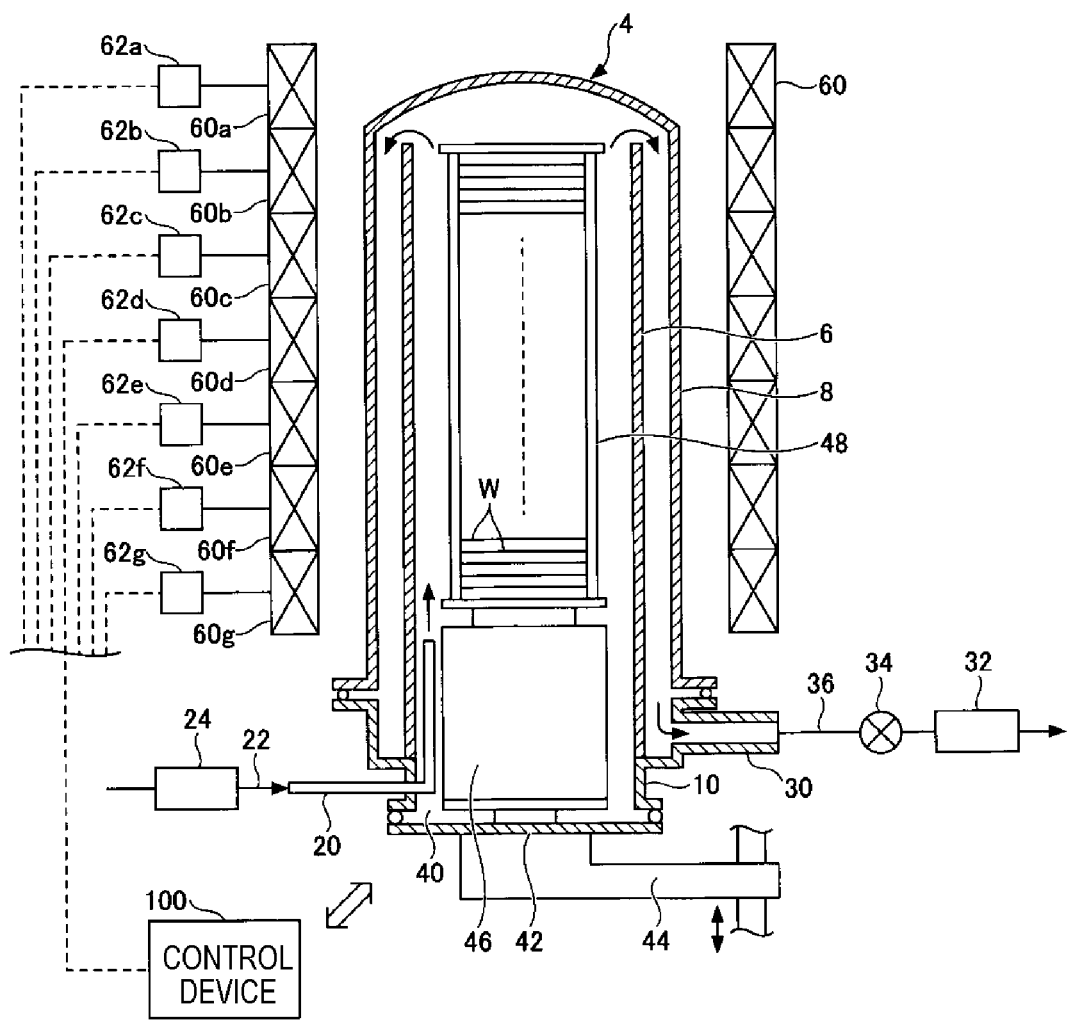
FIG. 1 is a schematic view illustrating an exemplary configuration of a substrate processing apparatus according to an exemplary embodiment.

In the following detailed description, reference is made to the accompanying drawing, which form a part hereof. The illustrative embodiments described in the detailed description, drawing, and claims are not meant to be limiting. Other embodiments may be utilized, and other changes may be made without departing from the spirit or scope of the subject matter presented here.

In manufacturing a semiconductor device, in some cases, a laminated film in which a plurality of films are laminated may be formed on a substrate by successively forming films while changing a film formation condition, such as, for example, the type of a film formation gas, within the same processing container. Among these laminated films, for example, because the difference between the refractive indexes of the respective films constituting the laminated film is small, it may be difficult to measure the film thickness of respective films in the laminated state.

When calculating an optimum film formation condition in such a laminated film, first, a first film is formed on a substrate, and a film formation condition of the first film is adjusted using a measured value of a property of the formed first film. Subsequently, a second film is formed on the first film, and a film formation condition of the second film is adjusted using a measured value of a property of the formed laminated film. Thus, because the procedure of adjusting the film formation condition of the laminated film is complex, it is difficult to easily adjust the film formation condition of the laminated film.

In addition, when the second film is formed on the first film without sufficient implementation of the adjustment of the film formation condition of the first film, a laminated film having a predetermined target property may not be acquired in some cases even if the film formation condition of the second film is adjusted. In addition, it is not easy to determine whether or not it is good to adjust the film formation condition of the first film until a certain degree of property may be acquired, prior to forming the laminated film.

Thus, in one aspect, the present disclosure provides a control device, which may easily adjust a film formation condition of a laminated film.

According to an aspect of the present disclosure, there is provided a control device for controlling an operation of a substrate processing apparatus that forms a laminated film by forming a first film on a substrate, and thereafter forming a second film. The control device includes: a recipe memory unit configured to store film formation conditions including a first film formation condition to form the first film and a second film formation condition to form the second film; a model memory unit configured to store process models including a first process model that represents an effect of the first film formation condition on a property of the first film and a second process model that represents an effect of the second film formation condition on a property of the second film; and a controller configured to: adjust the second film formation condition based on a measured value of a property of the laminated film including the first film and the second film, which are formed by the first film formation condition and the second film formation condition stored in the recipe memory unit, respectively, and the second process model stored in the model memory unit; and determine whether or not to adjust the first film formation condition based on an expected value of the property of the laminated film, which is expected when forming the laminated film by the first film formation condition and the adjusted second film formation condition.

In the control device, the controller determines to adjust the first film formation condition when the expected value of the property of the laminated film does not satisfy a target property of the laminated film.

In the control device, when it is determined to adjust the first film formation condition, the controller notifies that an adjustment of the first film formation condition is required.

In the control device, when it is determined to adjust the first film formation condition, the controller adjusts the first film formation condition so that the expected value of the property of the laminated film coincides with a target value of the property of the laminated film based on the measured value of the property of the laminated film including the first film and the second film, which are formed by the first film formation condition and the second film formation condition stored in the recipe memory unit, respectively, and the first process model stored in the model memory unit.

In the control device, when it is determined to adjust the first film formation condition, the controller controls the operation of the substrate processing apparatus so as to form the laminated film by the adjusted first film formation condition and the adjusted second film formation condition.

In the control device, the laminated film is a film that is successively formed in the substrate processing apparatus.

In the control device, the first film and the second film include the same element.

In the control device, the property of the laminated film is a film thickness.

In the control device, the property of the laminated film is a concentration of impurities.

According to another aspect of the present disclosure, there is provided a substrate processing system including: a substrate processing apparatus configured to form a laminated film by forming a first film on a substrate and then forming a second film; and a control device configured to control an operation of the substrate processing apparatus. The control device includes: a recipe memory unit configured to store film formation conditions including a first film formation condition to form the first film and a second film formation condition to form the second film; a model memory unit configured to store process models including a first process model that represents an effect of the first film formation condition on a property of the first film and a second process model that represents an effect of the second film formation condition on a property of the second film; and a controller configured to: adjust the second film formation condition based on a measured value of a property of the laminated film including the first film and the second film, which are formed by the first film formation condition and the second film formation condition stored in the recipe memory unit, respectively, and the second process model stored in the model memory unit; and determine whether or not to adjust the first film formation condition based on an expected value of the property of the laminated film, which is expected when forming the laminated film by the first film formation condition and the second film formation condition.

According to another aspect of the present disclosure, there is provided a substrate processing method including: performing a film formation process that includes a first film formation process of forming a first film on a substrate with a first film formation condition and a second film formation process of forming a second film on the first film with a second film formation condition; measuring a property of a laminated film including the first film and the second film formed in the film formation process; adjusting the second film formation condition based on a measured result of the property of the laminated film measured in the measurement process, and a second process model that represents an effect of the second film formation condition on a property of the second film; and determining whether or not to adjust the first film formation condition based on an expected value of the property of the laminated film, which is expected when the laminated film is formed by the first film formation condition and the second film formation condition adjusted in the adjustment process.

In the substrate processing method, the film formation process includes a processing process of performing a predetermined processing on the first film, and the processing process is performed after the first film formation process and before the second film formation process.

In the substrate processing method, the predetermined processing includes an etching processing that etches the first film.

According to still another aspect of the present disclosure, there is provided a non-transitory computer-readable storage medium storing a program that, when executed, causes a computer to perform the above-described substrate processing method.

According to the control device disclosed herein, a film formation condition of a laminated film can be easily adjusted.

Hereinafter, an exemplary embodiment for carrying out the present disclosure will be described with reference to the drawings. In addition, in this specification and drawings, substantially the same configurations will be given the same reference numerals, and redundant descriptions will be omitted.

(Substrate Processing Apparatus)

A substrate processing apparatus of the present exemplary embodiment will be described. The substrate processing apparatus of the present exemplary embodiment is a batch-type apparatus in which a substrate holding mechanism may be accommodated in a processing container so as to hold therein a plurality of semiconductor wafers (hereinafter, referred to as "wafers") as exemplary substrates at predetermined intervals in the vertical direction, and a film may be formed on the wafers at the same time.

FIG. 1 is a schematic view illustrating an exemplary configuration of the substrate processing apparatus according to the present exemplary embodiment.

As illustrated in FIG. 1, the substrate processing apparatus includes a processing container 4 having a substantially cylindrical shape, the longitudinal direction of which is the vertical direction. The processing container 4 has a double pipe structure including a cylindrical inner cylinder 6, and a ceilinged outer cylinder 8 concentrically disposed outside the inner cylinder 6. The inner cylinder 6 and the outer cylinder 8 are formed of, for example, a heat-resistant material such as quartz.

The inner cylinder 6 and the outer cylinder 8 are held at the lower ends thereof by a manifold 10, which is formed of, for example, stainless steel. The manifold 10 is fixed to, for example, a base plate (not illustrated). In addition, because the manifold 10 defines an inner space having a substantially cylindrical shape along with the inner cylinder 6 and the outer cylinder 8, it is assumed that the manifold 10 forms a portion of the processing container 4. That is, the processing container 4 includes the inner cylinder 6 and the outer cylinder 8, which are formed of, for example, a heat-resistant material such as quartz, and the manifold 10, which is formed of, for example, stainless steel, and the manifold 10 is provided below the side surface of the processing container 4 so as to hold the inner cylinder 6 and the outer cylinder 8 from the lower side.

The manifold 10 includes a gas introduction part 20 configured to introduce various gases such as, for example, a processing gas such as a film formation gas used in a film formation processing and an additive gas, and a purge gas used in a purge processing, into the processing container 4. Although FIG. 1 illustrates a form in which one gas introduction part 20 is provided, the present disclosure is not limited thereto, and a plurality of gas introduction parts 20 may be provided according to, for example, gas species to be used.

The type of the processing gas is not particularly limited, and may be appropriately selected according to, for example, the type of a film to be formed. For example, when a poly-silicon film having added phosphorus (P) (hereinafter, referred to as "D-poly film") is formed, mono-silane gas ($SiH_4$ gas) as the film formation gas and phosphine gas ($PH_3$ gas) as additive gas may be used. In addition, for example, when an amorphous silicon film (hereinafter, referred to as "a-Si film") is formed, $SiH_4$ gas may be used as the film formation gas.

The type of the purge gas is not particularly limited, and, for example, an inert gas such as, for example, nitrogen ($N_2$) gas may be used.

The gas introduction part 20 is connected to an introduction pipe 22 that is configured to introduce various gases into the processing container 4. In addition, the introduction pipe 22 is provided with, for example, a flow rate adjustment unit 24, such as a mass-flow controller, or a valve (not illustrated), so as to adjust a gas flow rate.

In addition, the manifold 10 includes a gas exhaust part 30 to evacuate the inside of the processing container 4. The gas exhaust part 30 is connected to an exhaust pipe 36, which includes, for example, a vacuum pump 32 capable of controlling the reduction of pressure within the processing container 4 and an opening variable valve 34.

The manifold 10 includes a furnace opening 40 formed in the lower end thereof, and the furnace opening 40 is provided with a cover 42, which has a disc shape and is formed of, for example, stainless steel. The cover 42 is provided to be movable up and down by, for example, an elevating mechanism 44, which functions as a boat elevator, and is configured to hermetically seal the furnace opening 40.

A heat insulation cylinder 46, which is formed of, for example, quartz, is installed above the cover 42. A wafer boat 48, which is formed of, for example, quartz, is disposed above the heat insulation cylinder 46 to hold, for example, about 50 to 175 wafers W in the horizontal state at predetermined intervals in multiple stages.

The wafer boat 48 is loaded (carried) into the processing container 4 by moving up the cover 42 using the elevating mechanism 44, and various film formation processings are performed on the wafers W held in the wafer boat 48. After the various film formation processings are performed, the wafer boat 48 is unloaded (carried out) from the processing container 4 to a loading area therebelow by moving down the cover 42 using the elevating mechanism 44.

On the outer circumferential side of the processing container 4, for example, a heater 60 having a cylindrical shape is provided to heat the processing container 4 to a predetermined temperature in a controlled manner.

The heater 60 is divided into a plurality of zones so that heaters 60a to 60g are provided from the top side to the bottom side in the vertical direction. The heaters 60a to 60g are configured such that the calorific values thereof may be independently controlled by power controllers 62a to 62g respectively. In addition, the inner wall of the inner cylinder 6 and/or the outer wall of the outer cylinder 8 are provided with temperature sensors (not illustrated) to correspond to the respective heaters 60a to 60g. Hereinafter, the zones in which the heaters 60a to 60g are provided are referred to as zone 1 to zone 7. In addition, although FIG. 1 illustrates a form in which the heater 60 is divided into seven zones, the present disclosure is not limited thereto, and the heater 60 may be divided into, for example, six or less zones or eight or more zones from the top side to the bottom side in the vertical direction. In addition, the heater 60 may not be divided into a plurality of zones.

The wafers W disposed in the wafer boat 48 constitute a single batch, and various film formation processings are performed on a per batch basis. In addition, at least one wafer W disposed in the wafer boat 48 may be a monitor wafer. In addition, the monitor wafer may be disposed to correspond to each of the divided heaters 60a to 60g.

In addition, the substrate processing apparatus of the present embodiment includes a control device 100, such as, for example, a computer to control an operation of the entire apparatus. The control device 100 is connected to a host computer by, for example, a wireless or wired communication device, and the substrate processing apparatus constitutes a substrate processing system.

(Control Device)

Figure 2:
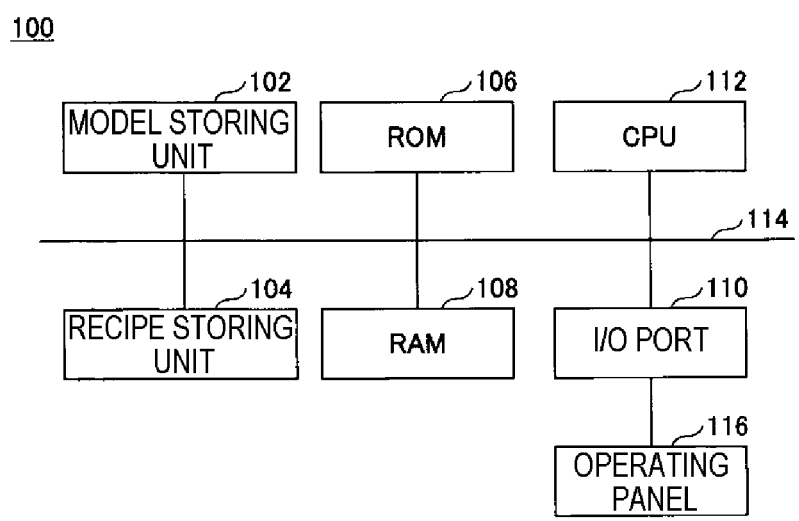
FIG. 2 is a schematic view illustrating an exemplary configuration of a control device according to an exemplary embodiment.

The control device 100 of the present exemplary embodiment will be described based on FIG. 2. FIG. 2 is a schematic view illustrating an exemplary configuration of the control device of the present exemplary embodiment.

As illustrated in FIG. 2, the control device 100 includes a model memory unit 102, a recipe memory unit 104, a ROM 106, a RAM 108, an I/O port 110, a CPU 112, and a bus 114 that interconnects the aforementioned components.

The model memory unit 102 stores, for example, a process model and a thermal model.

The process model refers to a model that represents the effect of the film formation condition, such as, for example, the film thickness, on the film formation result, and may include, for example, a temperature-film thickness model, a time-film thickness model, a pressure-film thickness model, and a gas flow rate-film thickness model. The temperature-film thickness model refers to a model that represents the effect of the temperature of the wafer W on the film thickness of a formed film. The time-film thickness model refers to a model that represents the effect of a film formation time on the film thickness of a formed film. The pressure-film thickness model refers to a model that represents the effect of pressure in the processing container 4 on the film thickness of a formed film. The gas flow rate-film thickness model refers to a model that represents the effect of the flow rate of a film formation gas on the film thickness of a formed film.

In addition, another process model may be a model that represents the effect of a film formation condition, such as, for example, the temperature of the wafer W, the film formation time, the pressure in the processing container 4, or the flow rate of the film formation gas on a film quality, such as, for example, the concentration of impurities in a formed film, sheet resistance, or reflectivity.

The process model is prepared for each film type.

In addition, the model memory unit 102 may store some or all of the above-described process models.

In addition to the above-described process models, the model memory unit 102 stores a thermal model.

The thermal model refers to a model that represents a relationship between the temperature of the wafer W and the set temperature of the heater 60. The thermal model is referred when determining the set temperature of the heater 60 so that the temperature of the wafer W becomes the temperature of the wafer W calculated by the process model, such as, for example, the temperature-film thickness model.

In addition, in these models, it is considered that there may be a case where a default (predetermined) value is not optimum depending on the film formation condition or the state of the substrate processing apparatus. Thus, the learning of the models may be performed by incorporating a learning function to the models by adding, for example, an extended Kalman filter to software.

The recipe memory unit 104 stores a process recipe, which determines a control sequence according to the type of a film formation processing that is performed in the substrate processing apparatus. The process recipe refers to a recipe that is prepared for each film formation processing that an operator performs in practice. The process recipe defines film formation conditions, such as, for example, temperature variation, pressure variation, the initiation and stop timings of the supply of various gases, and the supply amount of various gases from the carry-in of wafers W to the substrate processing apparatus to the carry-out of completely processed wafers W.

The ROM 106 is configured by, for example, an electrically erasable programmable ROM (EEPROM), a flash memory, or a hard disc, and is a storage medium that stores, for example, an operating program of the CPU 112.

The RAM 108 functions as, for example, a work area of the CPU 112.

The I/O port 110 supplies a measured signal related to the film formation conditions, such as, for example, a temperature, a pressure, and a gas flow rate, to the CPU 112. In addition, the I/O port 110 outputs a control signal output from the CPU 112 to each component (e.g., a power controller 62, a controller (not illustrated) of the opening variable valve 34, or the flow rate adjustment unit 24). In addition, the I/O port 110 is connected to an operating panel 116, using which the operator operates the substrate processing apparatus.

The CPU 112 executes an operating program stored in the ROM 106, and controls an operation of the substrate processing apparatus based on the process recipe stored in the recipe memory unit 104 in response to an instruction from the operating panel 116.

In addition, the CPU 112 calculates an optimum film formation condition based on the process model stored in the model memory unit 102. At this time, the CPU 112 calculates the film formation condition that satisfies the in-plane uniformity of the wafer W and the inter-plane uniformity of the wafer W based on, for example, a predetermined film thickness, film quality, and etching rate stored in the process recipe, which is read using an optimization algorithm, such as, for example, linear programming or quadratic programming.

In addition, the CPU 112 determines the set temperature of the heater 60 so as to become the temperature of the wafer W calculated by the process model based on the thermal model, which is stored in the model memory unit 102.

The bus 114 transmits information between the respective components.

However, in manufacturing a semiconductor device, in some cases, a laminated film in which a plurality of films is laminated may be formed on the wafer W via successive film formations with the difference of a film formation condition, such as, for example, the type of a film formation gas within the same processing container. Among these laminated films, because the difference between the properties (e.g., the refractive indexes) of the respective films constituting the laminated film is small, some may have difficulty in measuring the property (e.g., the film thickness) of the respective films in the laminated state.

For example, in a laminated film in which a second film, which includes the same element as a first film, is formed on the first film, the difference between the properties of the first film and the second film is small. Therefore, it is difficult to separately measure the property of the first film and the property of the second film in the laminated state.

In addition, in a laminated film in which, after a first film is formed, and thereafter is subjected to a predetermined processing, such as, for example, an etching processing, a second film is formed on the processed first film under the same condition as the condition under which the first film has been formed, there is no difference between the properties of the first film and the second film. Therefore, it is difficult to separately measure the property of the first film and the property of the second film in the laminated state.

When calculating an optimum film formation condition in such a laminated film, first, a first film is formed on a substrate, and a film formation condition of the first film (hereinafter, referred to as a "first film formation condition") is adjusted using a measured value of a property of the formed first film. Subsequently, a second film is formed on the first film, and a film formation condition of the second film (hereinafter, referred to as a "second film formation condition") is adjusted using a measured value of a property of the formed laminated film. As such, the procedure of adjusting the film formation condition of the laminated film is complex, and thus it is not easy to adjust the film formation condition of the laminated film.

In addition, when the second film is formed on the first film without sufficient implementation of the adjustment of the film formation condition of the first film, a laminated film having a predetermined target property may not be acquired in some cases even if the film formation condition of the second film is adjusted. In addition, it is not easy to determine whether or not it is good to adjust the film formation condition of the first film until a certain degree of property may be acquired, prior to forming the laminated film.

Accordingly, in the present exemplary embodiment, the control device 100 first adjusts the second film formation condition based on a measured result of a property of the laminated film in which the second film is formed on the first film and the process model that represents the effect of the second film formation condition on a property of the second film, which is stored in the model memory unit 102. Subsequently, the control device 100 determines whether or not to adjust the first film formation condition based on an expected value of the property of the laminated film, which is expected when the laminated film is formed using the adjusted second film formation condition. Thereby, the operator may easily adjust the film formation condition of the laminated film even if the operator has little knowledge or experience related to a semiconductor manufacturing apparatus or a semiconductor process.

Next, descriptions will be made on an operation (adjustment processing) of the control device 100 of the present exemplary embodiment. Hereinafter, descriptions will be made with reference to a case where a D-poly film is formed on the wafer W, and thereafter an a-Si film is formed thereon to form a laminated film, by way of example. The D-poly film is an exemplary first film, and the a-Si film is an exemplary second film.

Figure 3:
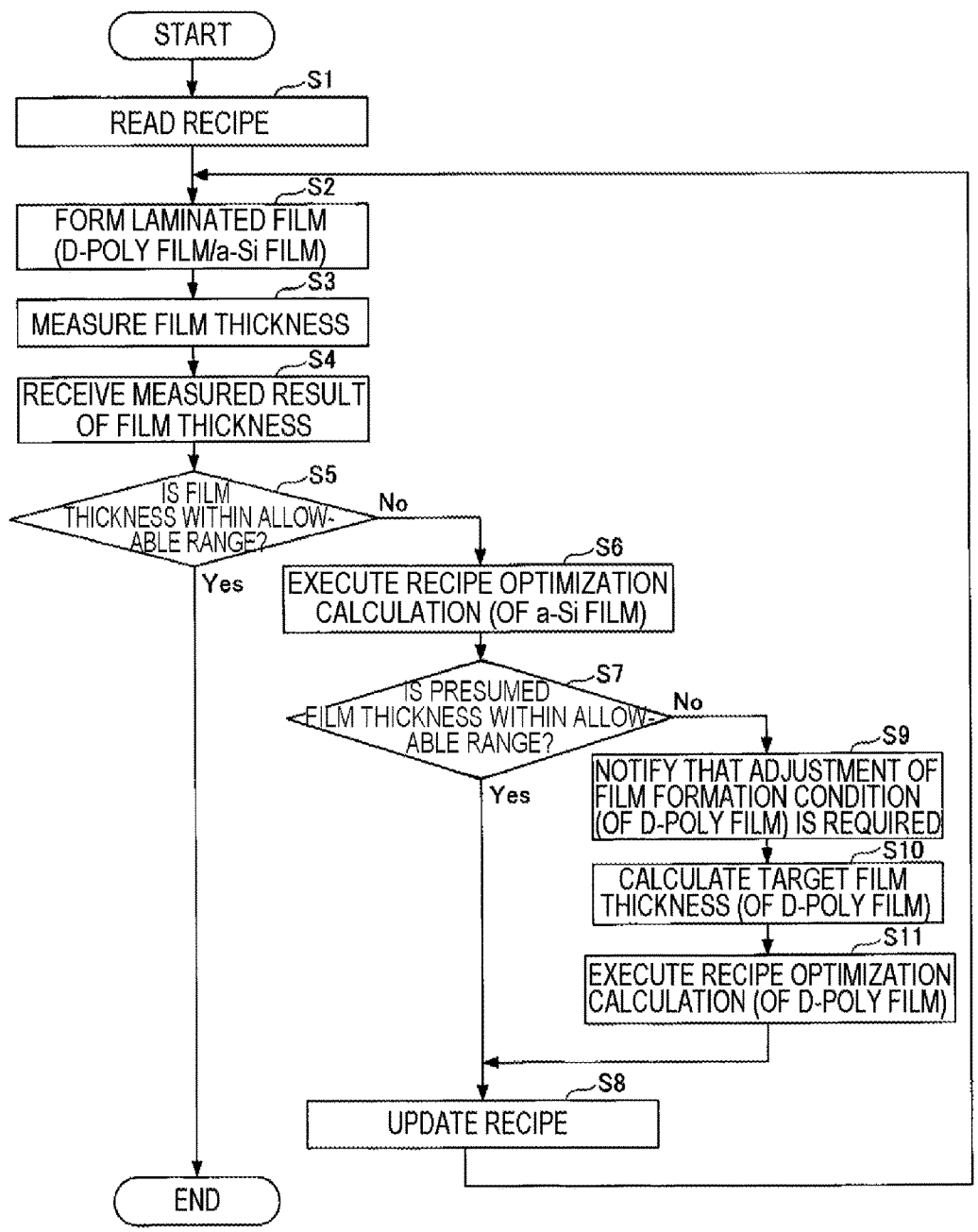
FIG. 3 is a flowchart for explaining an exemplary operation of a substrate processing system according to an exemplary embodiment.

FIG. 3 is a flowchart for explaining an exemplary operation of a substrate processing system according to the present exemplary embodiment.

The adjustment processing of the present exemplary embodiment may be performed in a setup step before a film formation processing is performed, or may be performed simultaneously with the film formation processing. In addition, in the adjustment processing, the operator may operate the operating panel 116 to select a process type (e.g., formation of a laminated film of a D-poly film and an a-Si film) and to input, for each zone, a target value of the film thickness (a target film thickness) of the laminated film to be formed.

When required information, such as, for example, the process type, is input and a start command is received, the CPU 112 reads the process recipe corresponding to the input process type from the recipe memory unit 104 (step S1).

Subsequently, a laminated film of a D-poly film and an a-Si film is formed on the wafer W (step S2: a film formation process). Specifically, the CPU 112 moves down the cover 42, and disposes the wafer boat 48 having the wafers W mounted at least in the respective zones on the cover 42. Subsequently, the CPU 112 moves up the cover 42 to carry the wafer boat 48 into the processing container 4. Subsequently, the CPU 112 controls, for example, the flow rate adjustment unit 24, the opening variable valve 34, and the power controllers 62a to 62g based on the process recipe read from the recipe memory unit 104, so as to form the laminated film in which the D-poly film and the a-Si film are sequentially laminated on the wafer W. The D-poly film is formed by supplying a mixed gas of SiH4 gas and PH3 gas to the wafer W and depositing a film via a chemical reaction in a gas phase. The a-Si film is formed by supplying SiH4 gas to the wafer W on which the D-poly film has been formed and depositing a film via a chemical reaction in a gas phase. In addition, after the D-poly film is formed, and thereafter a predetermined processing, such as for example, an etching processing, is performed on the D-poly film, the a-Si film may be formed.

After the laminated film is formed, the CPU 112 moves down the cover 42 to carry out the wafer W having the laminated film formed thereon. A host computer transports the carried-out wafer W to a film thickness gauge (not illustrated), so as to measure the film thickness of the laminated film (step S3: a measurement process). When the film thickness of the laminated film is measured, the film thickness gauge transmits the measured film thickness to the CPU 112 via the host computer. In addition, the operator may input the film thickness measured by the film thickness gauge by operating the operating panel 116.

When the CPU 112 receives the measured film thickness of the laminated film (step S4), the CPU 112 determines whether or not the film thickness of the laminated film is within an allowable range of the target film thickness of the laminated film (step S5). The term "within the allowable range" means that the film thickness is included within a predetermined allowable range from the input target film thickness of the laminated film, and refers to, for example, a case where the thickness is within ±1% from the input target film thickness of the laminated film.

In step S5, when it is determined that the film thickness of the laminated film is within the allowable range of the target film thickness of the laminated film, the CPU 112 terminates the adjustment processing. In step S5, which it is determined that the film thickness of the laminated film is not within the allowable range of the target film thickness of the laminated film, the CPU 112 executes recipe optimization calculation of the a-Si film (step S6: an adjustment process). In the recipe optimization calculation, the film formation condition of the a-Si film, such as, for example, the temperature of the wafer W or the film formation time, is optimized based on the film thickness of the laminated film received in step S4 and the process model that represents the effect of the film formation condition of the a-Si film on the property of the a-Si-film, which is stored in the model memory unit 102. At that time, the film formation condition of the a-Si film, such as, for example, the temperature of the wafer W in each zone or the film formation time, by which the film thickness of the laminated film becomes the target film thickness, is calculated using an optimization algorithm, such as, for example, linear programming or quadratic programming In addition, the set temperature of the heaters 60a to 60g is calculated to be the temperature of the wafer W calculated by the process model that represents the effect of the film formation condition of the a-Si film on the property of the a-Si film based on the thermal model stored in the model memory unit 102. In addition, in the recipe optimization calculation of the a-Si film, the film thickness of a single D-poly film may be measured at least one time, and the state of the measured film thickness of the single D-poly film may be recognized, so as to be used in the calculation. In addition, the film formation condition of the a-Si film is an exemplary second film formation condition, and the process model that represents the effect of the film formation condition of the a-Si film on the property of the a-Si film is an exemplary second process model.

Subsequently, the CPU 112 determines whether or not the film thickness, which is expected when the laminated film is formed by the film formation condition of the D-poly film stored in the recipe memory unit 104 and the film formation condition of the a-Si film calculated in step S6, (hereinafter, referred to as "expected film thickness") is the film thickness within the allowable range of the target film thickness of the laminated film (step S7: a determination process). At this time, when the expected film thickness of the laminated film is calculated with respect to a plurality of wafers W, the determination may be based on whether or not the expected film thickness of the laminated film on at least one wafer W is within the allowable range of the target film thickness of the laminated film. In addition, the determination may be based on whether or not a deviation (inter-plane uniformity) of the expected film thickness of the laminated film on the plurality of wafers W is within the allowable range of the target film thickness of the laminated film. In addition, the film formation condition of the D-poly film is an exemplary first film formation condition.

Figure 4:
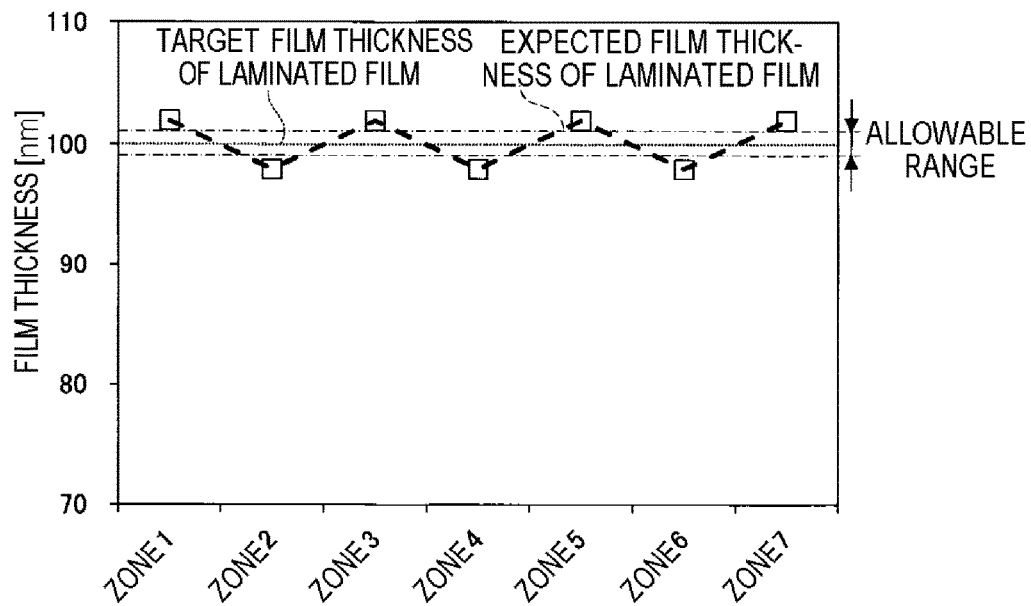
FIG. 4 is a view for explaining a relationship between an expected film thickness of a laminated film and a target film thickness of the laminated film.

FIG. 4 is a view for explaining a relationship between the expected film thickness of the laminated film and the target film thickness of the laminated film. FIG. 4 illustrates a relationship between the expected film thickness of the laminated film and the target film thickness of the laminated film for each zone. In FIG. 4, the expected film thickness of the laminated film is represented by the thick dashed line, and the target film thickness of the laminated film is represented by the thin dotted line.

In the example of FIG. 4, in all zones (zone 1 to zone 7), because the expected film thickness of the laminated film is not within the allowable range (±1 nm) of the target film thickness (100 nm) of the laminated film, the CPU 112 determines that the expected film thickness of the laminated film is not within the allowable range of the target film thickness of the laminated film.

Meanwhile, unlike the example of FIG. 4, in step S7, when it is determined that the expected film thickness of the laminated film is within the allowable range of the target film thickness, the CPU 112 updates the process recipe read in step S1 (step S8). Specifically, the CPU 112 updates the film formation condition of the a-Si film of the process recipe, read in step S1, to the film formation condition calculated in step S6. After updating the process recipe, the CPU 112 returns to step S2. The update of the process recipe may be overwriting of an existing process recipe, or may be writing of a new process recipe, separately from the existing process recipe.

In step S7, when it is determined that the expected film thickness of the laminated film is not within the allowable range of the target film thickness, the CPU 112 notifies that adjustment of the film formation condition of the D-poly film is required (step S9). For example, the CPU 112 displays, on the operating panel 116, that adjustment of the film formation condition of the D-poly film is required.

Subsequently, the CPU 112 calculates the target film thickness of the D-poly film, which is used when executing the recipe optimization calculation of the D-poly film (step S10). In the calculation of the target film thickness of the D-poly film, the target film thickness of the D-poly film is calculated so that the expected film thickness of the laminated film coincides with the target film thickness of the laminated film. Specifically, the target film thickness of the D-poly film may be calculated by the following Equation (1) and Equation (2).

(Target film thickness of D-poly film)=(Measured value of film thickness of D-poly film)+(Film thickness adjustment amount)  (1)

(Film thickness adjustment amount)=(Target film thickness of D-poly film)−(Expected film thickness of laminated film)  (2)

Figure 5:
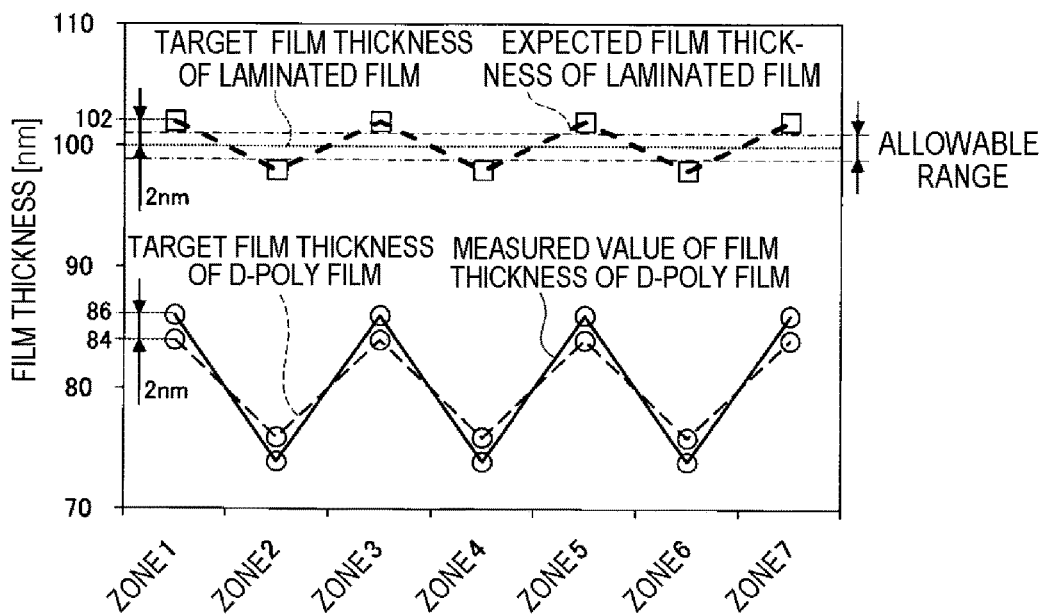
FIG. 5 is a view for explaining a method of calculating a target film thickness of a D-poly film.

FIG. 5 is a view for explaining a method of calculating the target film thickness of the D-poly film. FIG. 5 illustrates the expected film thickness of the laminated film, the target film thickness of the laminated film, a measured value of the film thickness of the D-poly film, and a target film thickness of the D-poly film for each zone. In FIG. 5, the expected film thickness of the laminated film is represented by the thick dashed line, the target film thickness of the laminated film is represented by the thin dotted line, the measured value of the film thickness of the D-poly film is represented by the thin solid line, and the target film thickness of the D-poly film is represented by the thin dashed line.

As illustrated in FIG. 5, for example, the expected film thickness (102 nm) of the laminated film in zone 1 was 2 nm thicker than the target film thickness (100 nm) of the laminated film. That is, the film thickness adjustment amount is −2 nm by Equation (2). Accordingly, the target film thickness of the D-poly film may be calculated to 84 nm by adding the film thickness adjustment amount (−2 nm) to the measured value of the film thickness of the D-poly film (86 nm) by Equation (1).

Subsequently, the CPU 112 executes recipe optimization calculation of the D-poly film (step S11). In the recipe optimization calculation, the film formation condition of the D-poly film is optimized based on the film thickness of the laminated film received in step S4 and the process model that represents the effect of the film formation condition of the D-poly film on the film formation result, which is stored in the model memory unit 102. At that time, the CPU calculates the film formation condition of the D-poly film, such as, for example, the temperature of the wafer W in each zone or the film formation time, by which the film thickness of the D-poly film becomes the target film thickness of the D-poly film calculated in step S10, using an optimization algorithm, such as, for example, linear programming or quadratic programming In addition, when the D-poly film (single film) is formed under the film formation condition of the D-poly film, which is stored in the recipe memory unit 104 before an adjusting processing, and the film thickness of the formed D-poly film is measured, instead of the film thickness of the laminated film received in step S4, the film thickness of the D-poly film may be used. In addition, the process model that represents the effect of the film formation condition of the D-poly film on the film formation result is an exemplary first process model.

Subsequently, the CPU 112 updates the process recipe read in step S1 (step S8). Specifically, the CPU 112 updates the film formation condition of the D-poly film of the process recipe, read in step S1, to the film formation condition of the D-poly film calculated in step S11. In addition, the CPU 112 updates the film formation condition of the a-Si film of the process recipe, read in step S1, to the film formation condition of the a-Si film calculated in step S6. After updating the process recipe, the CPU 112 returns to step S2. The update of the process recipe may be overwriting of an existing process recipe, or may be writing of a new process recipe, separately from the existing process recipe.

With the above description, the film formation condition of the laminated film may be adjusted. In addition, the adjustment processing is given by way of example, and, for example, in step S7, when it is determined that the expected film thickness of the laminated film is not within the allowable range of the target film thickness, the CPU 112 may perform step S10 and step S11 without performing step S9. In addition, in step S7, when it is determined that the expected film thickness of the laminated film is not within the allowable range of the target film thickness, in step S9, the CPU 112 may simply notify that the adjustment of the film formation condition of the D-poly film is required. In this case, the processing may stop until the operator performs an operation to resume the processing.

As described above, in the present exemplary embodiment, the control device 100 first adjusts the film formation condition of the a-Si film based on the measured value of the property of the laminated film in which the a-Si film is formed on the D-poly film and the process model that represents the effect of the film formation condition of the a-Si film on the property of the a-Si film, which is stored in the model memory unit 102. Subsequently, the control device 100 determines whether or not to adjust the film formation condition of the D-poly film based on the expected value of the property of the laminated film, which is expected when the laminated film is formed using the adjusted film formation condition of the a-Si film. Thereby, the operator may easily adjust the film formation condition of the laminated film even if the operator has little knowledge or experience related to a semiconductor manufacturing or a semiconductor process. In addition, the time taken until the optimum film formation condition of the laminated film is calculated may be reduced.

Although the control device, the substrate processing system, the substrate processing method, and the program have been described above by the exemplary embodiment, the present disclosure is not limited to the exemplary embodiment, and various modifications and improvements are possible within the scope of the present disclosure.

Although the present exemplary embodiment has been described with reference to a case of forming the polysilicon film having added phosphorus using the mixed gas of SiH4 gas and PH3 gas by way of example, the film formation gas is not limited to SiH4 gas, and may be, for example, disilane gas (Si2H6 gas). In addition, the added impurity is not limited to phosphorus, and may be, for example, boron (B).

In addition, although the present exemplary embodiment has been described with reference to a case where the a-Si film is formed using SiH4 gas by way of example, the film formation gas is not limited to SiH4 gas, and may be any other film formation gas that enables the formation of the a-Si film.

In addition, although the present exemplary embodiment has been described with reference to a case where the laminated film of the D-poly film and the a-Si film is formed by way of example, the laminated film is not limited thereto. The laminated film may be the film that has difficulty in measuring the property of the respective films in the laminated state, and may be, for example, the laminated film formed by films including the same element. Specifically, the laminated film may be two polysilicon films having different film formation conditions, or may be two a-Si films having different film formation conditions. In addition, the method of forming the laminated film is not particularly limited, and may be, for example, chemical vapor deposition (CVD) or atomic layer deposition (ALD).

In addition, although the present exemplary embodiment has been described with reference to the laminated film formed by two films by way of example, the laminated film is not limited thereto. The laminated film may be the film formed by three or more films.

In addition, although the present exemplary embodiment has been described with reference to a case of adjusting the set temperature of the heater 60 and the film formation time by recipe optimization calculation, only the set temperature of the heater 60 may be adjusted, or only the film formation time may be adjusted. In addition, one film formation condition selected from other film formation conditions, for example, the flow rate of the film formation gas, the supply time of the film formation gas, the pressure in the processing container 4, the supply time of the purge gas, and the number of revolutions per minute (rotational speed) of the wafer boat 48 may be adjusted. In addition, a plurality of film formation conditions selected from these film formation conditions may be adjusted at the same time.

In addition, although the present exemplary embodiment has been described with reference to a case of forming the laminated film having a predetermined film thickness by way of example, the property of the laminated film is not limited thereto, and, for example, may be any other property, such as, for example, the concentration of impurities, sheet resistance, reflectivity, and etching resistance of the laminated film. In this case, the process model that represents the effect of the film formation condition, such as, for example, the temperature of the wafer W, the film formation time, the pressure in the processing container 4, or the flow rate of the film formation gas, on a film quality, such as, for example, the concentration of impurities, sheet resistance, and reflectivity of the laminated film may be used.

In addition, although the present exemplary embodiment has been described with reference to a batch type apparatus in which a plurality of wafers W disposed in the wafer boat constitutes a single batch and a film formation processing is performed on each batch by way of example, the present disclosure is not limited thereto. For example, the present disclosure may be applied to a semi-batch type apparatus in which a film formation processing is performed on a plurality of wafers W disposed on a holder, or a sheet type apparatus in which a film formation processing is performed on each wafer.

In addition, although the present embodiment has been described with reference to a case where the control device 100 that controls an operation of the substrate processing apparatus performs the adjustment processing by way of example, the present disclosure is not limited thereto. For example, a control device (group controller) or a host computer that collectively manages a plurality of devices may perform the adjustment processing.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

What is claimed is:

1. A control device that controls an operation of a substrate processing apparatus, the control device comprising:
a recipe memory configured to store film formation conditions including a first film formation condition to form a first film and a second film formation condition to form a second film;
a model memory configured to store process models including a first process model that represents an effect of the first film formation condition on a property of the first film and a second process model that represents an effect of the second film formation condition on a property of the second film; and
a controller configured to:
control the substrate processing apparatus to form a laminated film of the first film and the second film by sequentially using the first film formation condition and the second film formation condition stored in the recipe memory;
measure a value of a property of the laminated film;

determine whether or not a measured value of the property of the laminated film satisfies a target value of the property of the laminated film;

update the second film formation condition based on the measured value of the property of the laminated film, and the second process model stored in the model memory when it is determined that the measured value of the property of the laminated film does not satisfy the target value of the property of the laminated film;

determine whether or not to update the first film formation condition based on an expected value of the property of the laminated film, which is expected when forming the laminated film by the first film formation condition and the updated second film formation condition; and when it is determined to update the first film formation condition, update the first film formation condition so that the expected value of the property of the laminated film coincides with the target value of the property of the laminated film based on the measured value of the property of the laminated film including the first film and the second film which are formed by the first film formation condition and the second film formation condition stored in the recipe memory, respectively, and the first process model stored in the model memory.

2. The control device according to claim 1, wherein the controller determines to update the first film formation condition when the expected value of the property of the laminated film does not satisfy the target value of the property of the laminated film.

3. The control device according to claim 1, wherein, when it is determined to update the first film formation condition, the controller notifies that an update of the first film formation condition is required.

4. The control device according to claim 1, wherein, when it is determined to update the first film formation condition, the controller controls the operation of the substrate processing apparatus so as to form the laminated film by the updated first film formation condition and the updated second film formation condition.

5. The control device according to claim 1, wherein the laminated film is a film that is successively formed in the substrate processing apparatus.

6. The control device according to claim 1, wherein the first film and the second film include a same element.

7. The control device according to claim 1, wherein the property of the laminated film is a film thickness.

8. The control device according to claim 1, wherein the property of the laminated film is a concentration of impurities.

9. The control device according to claim 1, wherein the model memory is configured to store a thermal model that represents a relationship between a temperature of the substrate and a set temperature of a heater of the substrate processing apparatus, and the controller is configured to update the set temperature of the heater to be the temperature of the substrate, based on the thermal model stored in the model memory.

10. The control device according to claim 1, wherein the controller is configured to measure a value of the property of the first film at least one time, and update the second film formation condition based on a measured value of the property of the first film.

11. The control device according to claim 10, wherein, when it is determined to update the first film formation condition, the controller is configured to calculate a target value of the property of the first film using the measured value of the property of the first film, the target value of the property of the laminated film, and the expected value of the property of the laminated film, and update the first film formation condition such that the measured value of the property of the first film becomes the target value of the property of the first film.

12. A substrate processing system comprising:
a substrate processing apparatus configured to form a laminated film by forming a first film on a substrate and then forming a second film; and
a control device configured to control an operation of the substrate processing apparatus,
wherein the control device includes:
a recipe memory configured to store film formation conditions including a first film formation condition to form the first film and a second film formation condition to form the second film;
a model memory configured to store process models including a first process model that represents an effect of the first film formation condition on a property of the first film and a second process model that represents an effect of the second film formation condition on a property of the second film; and
a controller configured to:
control the substrate processing apparatus to form the laminated film of the first film and the second film by sequentially using the first film formation condition and the second film formation condition stored in the recipe memory;
measure a value of a property of the laminated film;
determine whether or not a measured value of the property of the laminated film satisfies a target value of the property of the laminated film;
update the second film formation condition based on the second process model stored in the model memory when it is determined that the measured value of the property of the laminated film does not satisfy the target value of the property of the laminated film;
determine whether or not to update the first film formation condition based on an expected value of the property of the laminated film, which is expected when forming the laminated film by the first film formation condition and the updated second film formation condition; and
when it is determined to update the first film formation condition, update the first film formation condition so that the expected value of the property of the laminated film coincides with the target value of the property of the laminated film based on the measured value of the property of the laminated film including the first film and the second film which are formed by the first film formation condition and the second film formation condition stored in the recipe memory, respectively, and the first process model stored in the model memory.

13. The substrate processing system according to claim 12, wherein the model memory is configured to store a thermal model that represents a relationship between a temperature of the substrate and a set temperature of a heater of the substrate processing apparatus, and the controller is configured to update the set temperature of the heater to be the temperature of the substrate, based on the thermal model stored in the model memory.

14. The substrate processing system according to claim 12, wherein the controller is configured to measure a value of the property of the first film at least one time, and update the second film formation condition based on a measured value of the property of the first film.

15. The substrate processing system according to claim 14, wherein, when it is determined to update the first film formation condition, the controller is configured to calculate a target value of the property of the first film using the measured value of the property of the first film, the target value of the property of the laminated film, and the expected value of the property of the laminated film, and update the first film formation condition such that the measured value of the property of the first film becomes the target value of the property of the first film.

16. A substrate processing method comprising:
forming a laminated film of a first film and a second film by sequentially forming the first film on a substrate with a first film formation condition and forming the second film on the first film with a second film formation condition;
measuring a value of a property of the laminated film formed in the forming the laminated film;
determining whether or not a measured value of the property of the laminated film satisfies a target value of the property of the laminated film;
updating the second film formation condition based on the measured value of the property of the laminated film measured in the measuring, and a second process model that represents an effect of the second film formation condition on a property of the second film when it is determined that the measured value of the property of the laminated film does not satisfy the target value of the property of the laminated film;
determining whether or not to update the first film formation condition based on an expected value of the property of the laminated film, which is expected when the laminated film is formed by the first film formation condition and the second film formation condition updated in the updating; and
when it is determined to update the first film formation condition, updating the first film formation condition so that the expected value of the property of the laminated film coincides with the target value of the property of the laminated film based on the measured value of the property of the laminated film including the first film and the second film which are formed by the first film formation condition and the second film formation condition, respectively, and a first process model that represents an effect of the first film formation condition on a property of the first film.

17. A non-transitory computer-readable storage medium storing a program that, when executed, causes a computer to perform the substrate processing method of claim 16.

18. The substrate processing method according to claim 16, wherein the forming the laminated film includes performing a predetermined processing on the first film, and
the predetermined processing is performed after the forming the first film and before the forming the second film.

19. The substrate processing method according to claim 18, wherein the predetermined processing includes an etching processing that etches the first film.

* * * * *